(12) United States Patent
Ranmuthu et al.

(10) Patent No.: US 6,396,346 B1
(45) Date of Patent: May 28, 2002

(54) LOW NOISE MAGNETO-RESISTIVE READ HEAD PREAMPLIFIER

(75) Inventors: Indumini Ranmuthu, Plano; Echere Iroaga, Garland, both of TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/536,106

(22) Filed: Mar. 24, 2000

(51) Int. Cl.[7] .............................. H03F 3/45; H03F 1/14; G11B 5/09; G11B 5/02

(52) U.S. Cl. .................. 330/252; 330/292; 360/46; 360/67; 360/68

(58) Field of Search ................................ 330/252, 292; 360/46, 67, 68

(56) References Cited

U.S. PATENT DOCUMENTS

| | | | | |
|---|---|---|---|---|
| 5,757,233 A | * | 5/1998 | Kato et al. ................... | 330/254 |
| 5,831,888 A | | 11/1998 | Glover ......................... | 364/807 |
| 6,219,195 B1 | * | 4/2001 | Jusuf et al. ................... | 360/67 |
| 6,226,137 B1 | * | 5/2001 | Ngo ............................. | 360/46 |
| 6,252,457 B1 | * | 6/2001 | Umeyama et al. ........... | 330/252 |

* cited by examiner

Primary Examiner—Robert Pascal
Assistant Examiner—Patricia T. Nguyen
(74) Attorney, Agent, or Firm—Dwight N. Holmbo; Wade James Brady, III; Frederick J. Telecky, Jr.

(57) ABSTRACT

A magneto-resistive head preamplifier structure has a difference amplifier with cross-coupled transistors configured to cancel the adverse effects on preamplified output signals due to parasitic capacitance associated with the difference amplifier transistors. The cross-coupled transistors extend the useable bandwidth of the preamplifier by substantially reducing internally generated thermal noise.

20 Claims, 6 Drawing Sheets

LOW NOISE MAGNETO-RESISTIVE READ HEAD PREAMPLIFIER

BACKGROUND OF THE INVENTION

1. Field of the Invention

This invention relates generally to the field of information storage, and more particularly to hard disk drive magneto-resistive head preamplifiers.

2. Description of the Prior Art

The need for larger and faster mass storage devices continues to increase as computer hardware and software technology continues to progress. Electronic databases and computer applications such as multimedia applications, for example, require ever increasing amounts of disk storage space.

Hard disk drive (HDD) technology continues to evolve and advance in order to meet these ever increasing demands. U.S. Pat. No. 5,831,888, entitled Automatic Gain Control Circuit, and assigned to Texas Instruments Incorporated, the assignee of the present invention, sets forth generally the description of disk storage and is incorporated by reference herein in its entirety. An HDD performs write, read and servo operations when storing and retrieving data. During a read operation, the appropriate hard disk sector to be read is located and data that has been previously written to the disk is read. A read/write head senses the changes in the magnetic flux of the disk platter and generates a corresponding analog read signal. A read channel receives the analog read signal, conditions the signal and detects "zeros' and "ones" from the signal.

Hard disk drives are one type of disk storage that are particularly used in modem personal computers. A HDD device generally includes a magnetic storage media, such as rotating disks or platters, a spindle motor, read/write heads, an actuator, a preamplifier, a read channel, a write channel, a servo controller, a memory, and control circuitry to control the operation of the HDD and to properly interface the HDD to a host or system bus.

FIG. 1 illustrates a well known disk/head assembly 12 and a preamplifier 14. The preamplifier 14 handles both read functions and write functions. Not illustrated in FIG. 1, for clarity, is the Magneto-resistive (MR) head that connects to the preamplifier 14. An MR head works through magnetic media, using a different portion of the head to perform either a read or a write function. The write function portion of the MR head is inductive while the read function portion of the head acts as a magneto-resistive element to sense magnetic shifts in the disk assembly 12.

FIG. 2 is a simplified schematic diagram illustrating a well known portion of a read channel circuit suitable for use with the preamplifier 14 shown in FIG. 1.

Resistors $R_{MR1}$–$R_{MR6}$ represent the resistive portion of six MR heads. An input amplification stage 18 of preamplifier 14 connects to the resistive portion, $R_{MR1}$–$R_{MR6}$ of the MR heads. Later gain stages 20 of preamplifier 14 are connected to the outputs of input amplification stage 18 at nodes $N_A$ and $M_B$. The read path outputs flow from the later gain stages 20. The read channel inputs flow into preamplifier 14 from a head select logic stage. Preamplifier 14 may have as many as one to more than eight channels in typical HDD devices. Transistor $SW_1$ represents the read channel input enabling MOS transistor for head one of the six heads illustrated in FIG. 2. The other enabling MOS transistors for heads two through six are not illustrated to preserve clarity. Head one is illustrated as the selected head, while the remaining five heads are illustrated in the off condition with the respective bases of input NPN transistors $Q_2$–$Q_6$ being connected to the integrated circuit ground.

The architecture of input amplification stage 18 of preamplifier 14 can be seen to be formulated as a single ended amplifier having a single transistor $Q_{11}$ to set the voltage level on the load side of later gain stage 20. A differential amplifier, as is known to one of ordinary skill in the art of amplifier design, uses two transistors to establish the voltages on nodes N and M. A bias current $I_B$ travels through the load resistor $R_L$ and through the collector of transistor $Q_{11}$ to set the voltage level on node M. A bias current $I_{B/\alpha}$ passes through a scaling resistor $20_{RL}$ to set a reference voltage level on node N. The read head is generally biased at about 0.2 to about 0.5 volts to improve linearity characteristics during a read operation. This read head bias voltage is established via a feedback loop created by transconductance amplifier 22 across nodes M and N such that the amplifier 22 output is connected to the base of transistor $Q_1$ through MOS switch $SW_1$. This structure creates a pseudo-balanced output on the reader load resistors $R_L$ and $20_{RL}$ such as would exist if a differential amplifier were used in the input amplification stage.

Operation of Prior Art Preamplifier 14

NPN bipolar transistors $Q_{11}$ and $Q_1$ are active when head one is selected. Together with the load resistor $R_L$, $Q_{11}$ and $Q_1$ form a cascade amplifier. A cascade amplifier is a high bandwidth amplifier suitable for processing data at high speeds on the order of Mbits/sec. Both $Q_{11}$ and $Q_1$ are configured as common base amplifiers. As a magneto-resistive (MR) head moves over data, the head resistance $R_{MRX}$ varies much like an alternating current signal in series with the head resistance $R_{MRX}$. The NPN bipolar transistors $Q_{11}$ and $Q_1$ amplify a signal proportional to this variation in head resistance $R_{MRX}$. This amplified ac signal is passed through the load resistor $R_L$ and into the base of emitter follower transistor $Q_8$. The amplified ac signal then passes on to node $M_B$ that forms one input of the later gain stage 20 that is configured as a differential amplifier. The second input of the amplifier 20 is node $N_A$ that is set to be at a dc bias voltage equal to the voltage on the node $M_B$. Ideally, the node $N_A$ should not have an alternating current signal passing through it. Thus, the reference side of the single ended input amplification stage 18 consists of transistors $Q_B$, $Q_{21}$ and the scaling resistor $20_{RL}$. This structure supplies a current $I_{B/\alpha}$ through the scaling resistor $20_{RL}$, that provides a reference voltage at node N. Those skilled in the art will readily appreciate that if the dc voltage on nodes M and N are the same, then the input voltage on differential amplifier 20 at nodes $N_A$ and $M_B$ are the same. Thus, only node $M_B$ will see an ac signal. Because the dc voltages are equal in magnitude, the differential amplifier 20 will amplify only the ac signal and send it onto later gain stages.

FIGS. 3A and 3B show a more detailed schematic diagram illustrating a known architecture for a HDD read circuit MR head preamplifier 100 having a bipolar transistor differential amplifier structure and that is generally used for processing digital data at speeds up to about 1.6 Mbits/sec. These figures shall be used herein after to more particularly describe limitations associated with presently known preamplifier architectures. Looking now at FIG. 3A, the resistors $R_{RM1}$-$R_{MX}$ represent the variable head resistance associated with each respective magneto-resistive (MR) head. The following operating principles, although described with reference to resistor $R_{RM1}$, apply equally to each MR head. A read signal generated via $R_{RM1}$ is first amplified by a cascade amplifier formed by transistors Q12 and Q110 as well as load resistor $R_L$ depicted in stage 1 of FIG. 3A. The amplified read signal thus appears across load resistor $R_L$. The signal across load resistor $R_L$ is applied to an emitter follower amplifier formed by bipolar transistor Q16, also shown in stage 1. Following amplification of the read signal via transistor Q16, the amplified read signal is then passed to a differential amplifier comprising bipolar transistors Q21, Q22, Q23 and Q24 illustrated in stage 2. Although further amplification and signal processing takes place in stage 3 of the MR head preamplifier 100, this amplification and signal processing is not relevant to the present discussion. Therefore, discussion of the amplification and signal processing that takes place in stage 3 will not be discussed herein to preserve clarity. The MR head preamplifier 100 thus comprises a plurality of variable head resistances $R_{RM1-RMX}$, associated cascade amplifiers, emitter follower amplifiers and a differential amplifier, operationally and structurally similar to the corresponding elements of preamplifier 14 illustrated in FIG. 2 and discussed herein before.

A plurality of interrelated circuit properties adversely affect the bandwidth characteristics of the preamplifier 100. The useable bandwidth, for example, of the preamplifier 100 is significantly affected by the pole(s) created by the loading caused by the cascade amplifier bipolar transistors Q12, Q13 and so forth, as well as emitter follower amplifier transistor Q16, on the load resistor $R_L$. The loading characteristics of cascade amplifier bipolar transistors Q12, Q13 and so on as well as emitter follower amplifier transistor Q16 created at the load resistor $R_L$ are determined in part by the parasitic capacitances, e.g. collector-base, emitter-base, associated with each transistor.

Further, the noise properties associated with the preamplifier 100 are adversely affected by thermal noise contributions from cascade bipolar transistors Q110 and Q111 among others. Undesirable thermal noise is additionally generated by emitter follower amplifier transistor Q16 as well as differential amplifier transistors Q21 and Q22.

Recent advancements associated with HDD technology have made it desirable if not even necessary to further reduce noise associated with MR read head preamplifiers. Such noise reductions can be useful in formulating MR read head preamplifiers having very wide useable bandwidths essential for accommodating data processing speeds of more than 300 Mbits/sec. In view of the foregoing, it is desirable to provide a MR read head preamplifier having significantly reduced thermal noise and reduced capacitive loading characteristics such that data can be reliably processed via the preamplifier at speeds up to 320 Mbits/sec or even higher.

SUMMARY OF THE INVENTION

The present invention is directed to a HDD read head preamplifier architecture having a −1 dB bandwidth of about 160 MHz and that is suitable for use with hard disk drives with data rates up to about 320 Mbits/sec without sacrificing desirable read head current range properties. One embodiment of the present preamplifier 200 architecture comprises a common node that couples a plurality of read heads, i.e. resistors $R_{MR1-MRX}$, to a load resistor $R_L$ via a single shared common base amplifier. The resultant preamplifier architecture therefore does not suffer any degradation in bandwidth characteristics generally associated with dominant poles created using known preamplifier architectures where a large parasitic capacitance associated with multiple cascade amplifiers is coupled with a large load resistance to generate unwanted dominant poles. The shared common base amplifier replaces the more classic emitter follower amplifier that is generally used in the art to formulate the first preamplifier stage. Therefore, the dominant pole contributions generally associated with known first stage emitter follower amplifier architectures are effectively eliminated or substantially reduced since the familiar emitter follower architecture has also been replaced with a common base architecture. The read signal output from the common base amplifier is passed to a differential amplifier transistor pair where a pair of cross-coupled bipolar transistors are configured to substantially reduce or eliminate parasitic collector-base capacitance associated with the differential amplifier transistors. The present preamplifier architecture produces lower noise levels and greater useable bandwidth than that achievable by using HDD read head architectures presently known in the art.

The present invention thus provides various technical advantages. In one aspect of the invention, a HDD magnetoresistive read head preamplifier architecture is provided that eliminates or substantially reduces dominant poles caused by parasitic capacitance loading associated with a preamplifier input stage load resistor.

In another aspect of the invention, a HDD read head preamplifier structure is provided that substantially reduces noise levels generally associated with known read head preamplifier architectures.

In yet another aspect of the invention, a HDD read head preamplifier structure is provided that substantially improves the −1 dB bandwidth characteristics generally associated with known read head preamplifier architectures.

In still another aspect of the invention, a HDD read head preamplifier structure is provided that substantially improves the −1 dB bandwidth properties generally associated with known read head preamplifier architectures without sacrificing read head current range capabilities.

In another aspect of the invention, a HDD read head preamplifier structure is provided that functions with a larger value of load resistance than that generally associated with known read head preamplifier architectures, thereby providing reduced preamplifier generated noise and improved operating stability.

In yet another aspect of the invention, a HDD read head preamplifier structure provides improved noise characteristics sufficient to reduce error rates about an order of magnitude over that generally associated with known read head preamplifier structures.

In still another aspect of the invention, a HDD read head preamplifier structure provides a noise gain of about 10% over a −1 dB bandwidth of about 160 MHz while retaining desired read head current range characteristics.

BRIEF DESCRIPTION OF THE DRAWINGS

Other aspects and features of the present invention and many of the attendant advantages of the present invention will be readily appreciated as the same become better understood by reference to the following detailed description when considered in connection with the accompanying drawings in which like reference numerals designate like parts throughout the figures thereof and wherein.

While the above-identified drawing figures set forth alternative embodiments, other embodiments of the present invention are also contemplated, as noted in the discussion. In all cases, this disclosure presents illustrated embodiments of the present invention by way of representation and not limitation. Numerous other modifications and embodiments can be devised by those skilled in the art which fall within the scope and spirit of the principles of this invention.

DETAILED DESCRIPTION OF THE PREFERRED EMBODIMENTS

Figure 1:
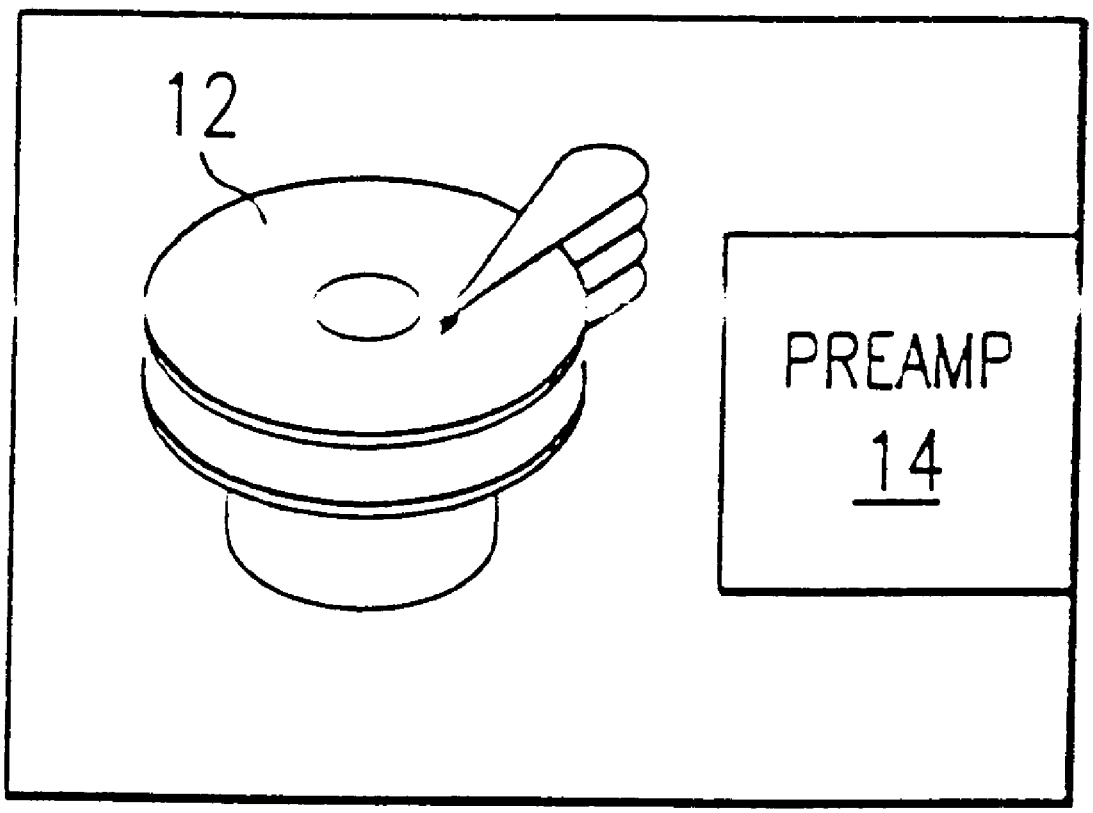
FIG. 1 illustrates a well known disk/head assembly and preamplifier for a typical hard disk drive (HDD) assembly.

FIG. 1, as stated above, illustrates a well known disk/head assembly 12 and a preamplifier 14. The preamplifier 14 handles both read functions and write functions. Further details have been discussed herein above and so will not be repeated below in order to preserve clarity and conciseness.

Figure 2:
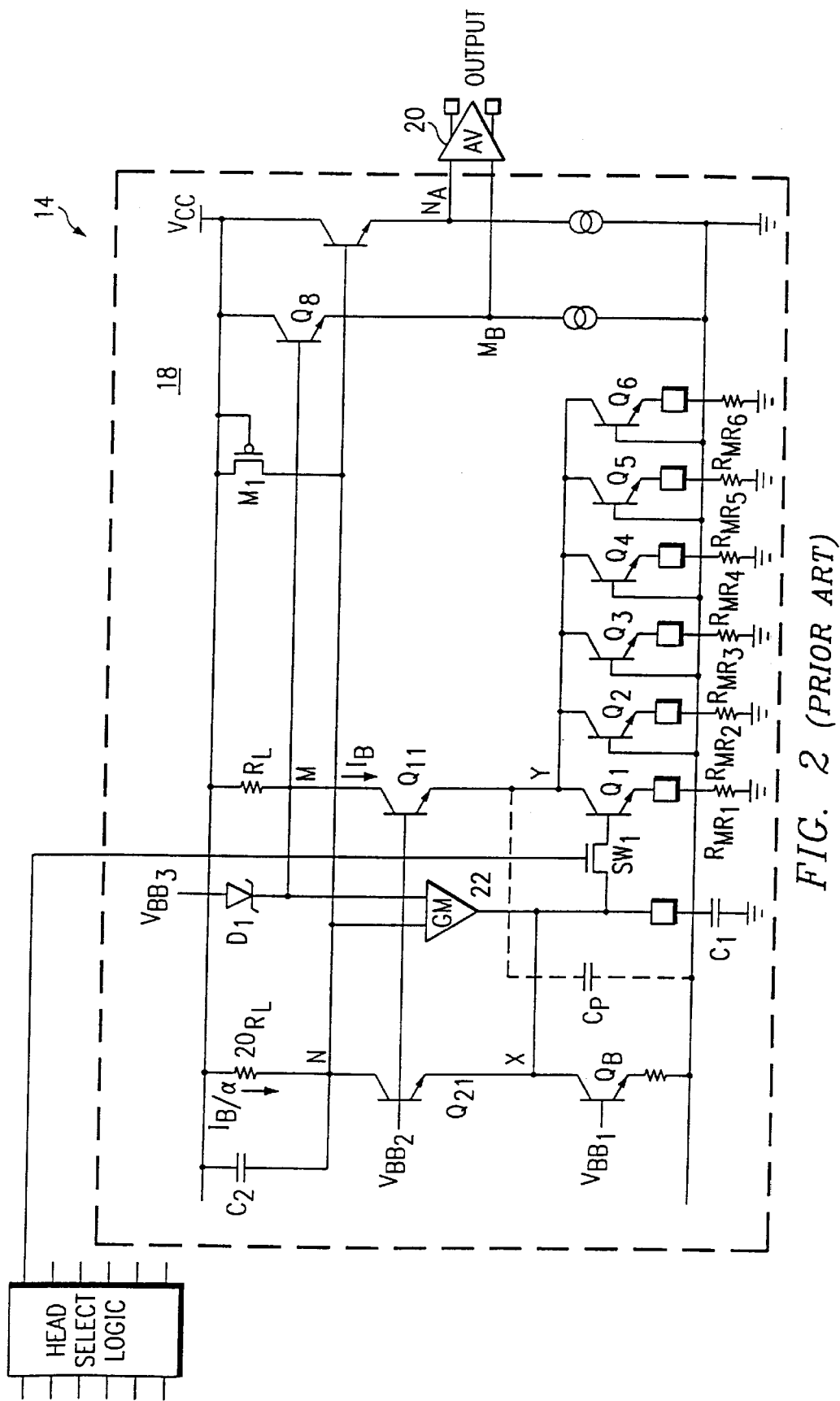
FIG. 2 is a simplified schematic diagram illustrating an input stage for a HDD read head preamplifier that is well known in the art.

FIG. 2 is a simplified schematic diagram illustrating an input stage 18 for a HDD read head preamplifier 14 that is well known in the art. Details of operation have been set forth herein above to provide a background for better understanding of the present invention. Further details will not be discussed herein for preservation of clarity and conciseness.

Figure 3A:
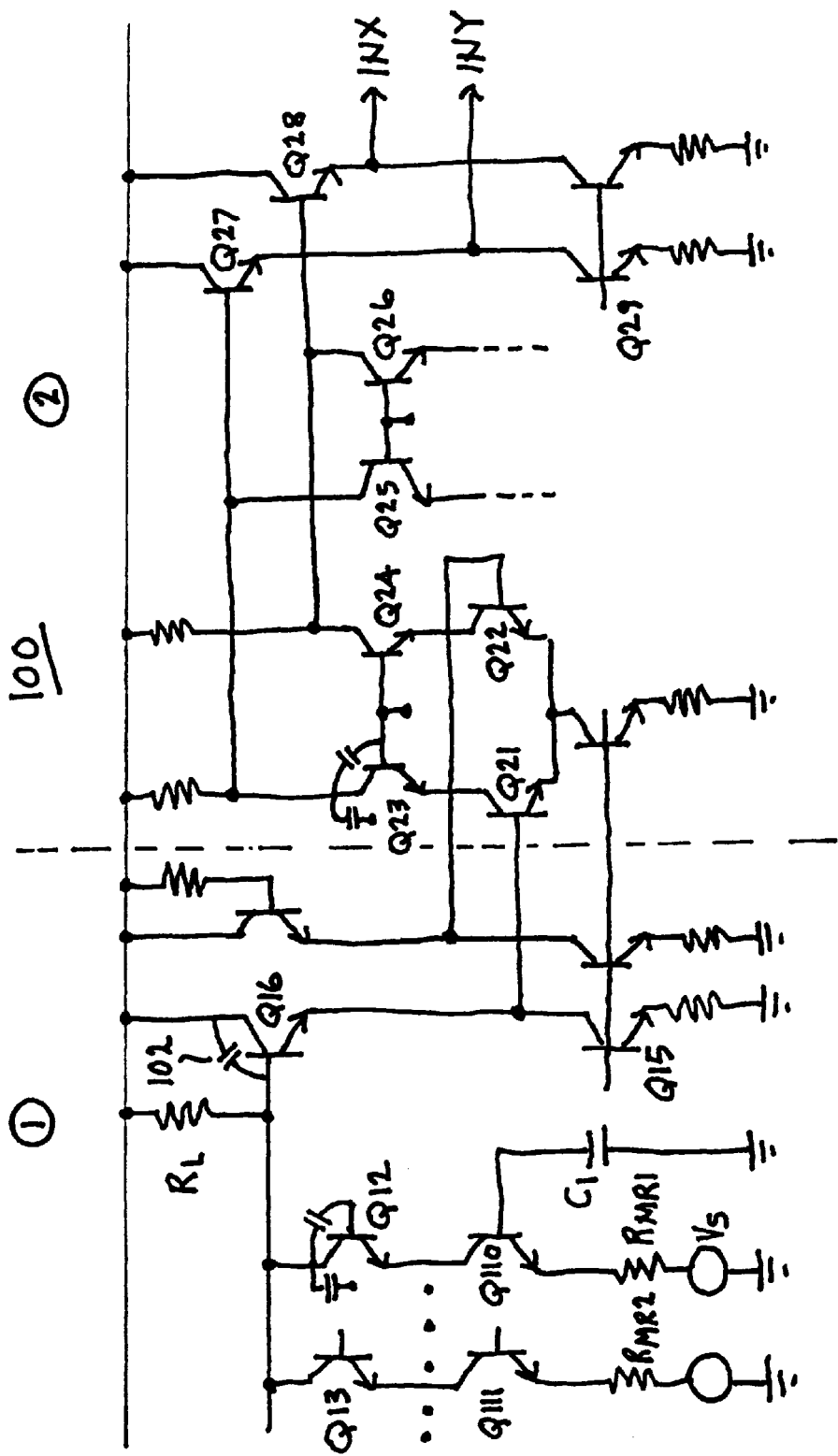
FIGS. 3A and 3B illustrate a more detailed schematic diagram depicting a well known read head preamplifier architecture.
Figure 3B:
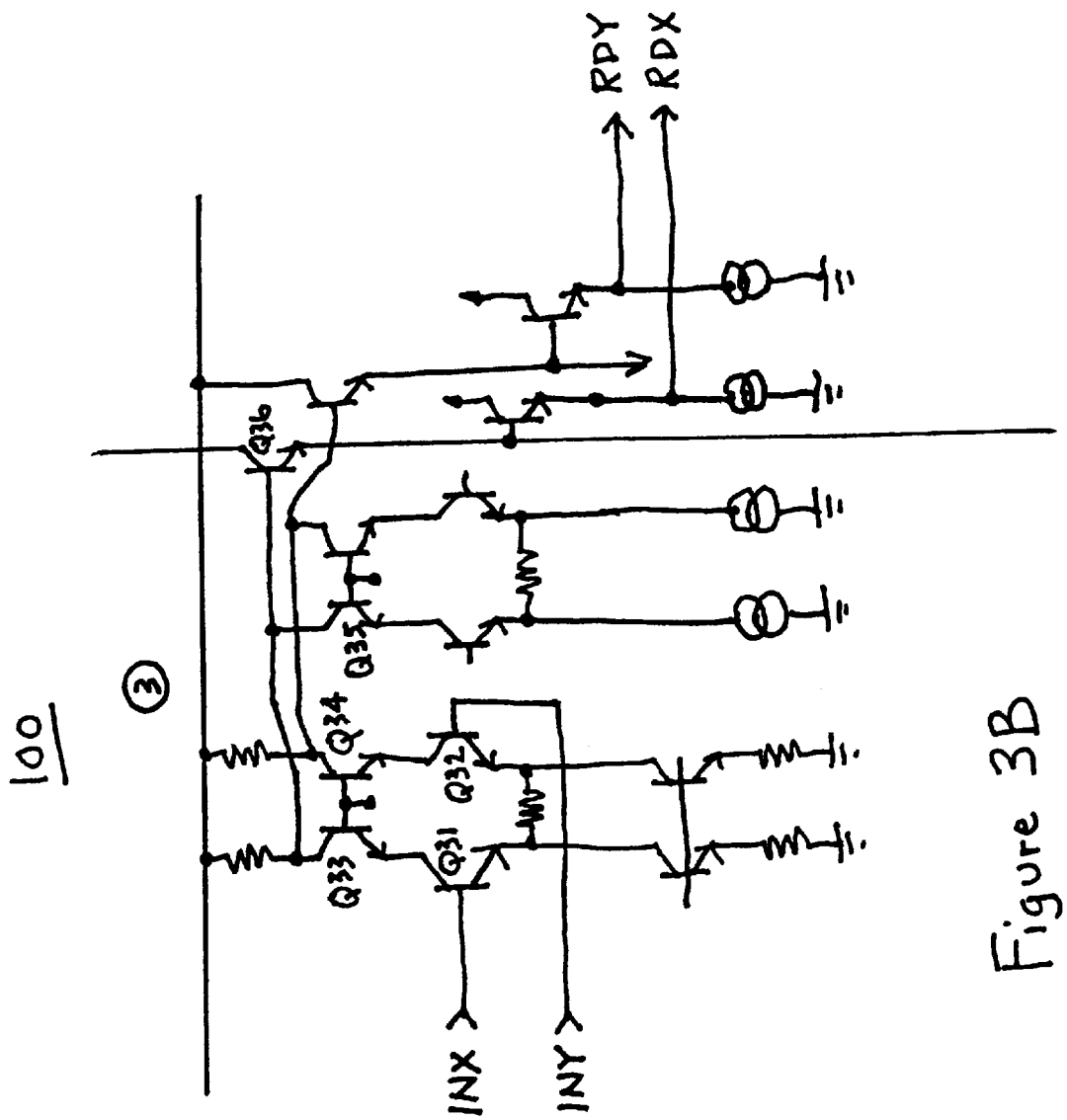

FIGS. 3A and 3B illustrate a more detailed schematic diagram depicting three stages of a well known read head preamplifier architecture 100. Preamplifier 100 comprises a bipolar transistor differential amplifier structure familiar to those skilled in the art of amplifier design, and that is generally used for processing digital data at speeds up to about 1.6 Mbits/sec. Resistors $R_{RM1-RMX}$ represent the variable head resistance portion of each respective magneto-resistive (MR) head (not shown). Preamplifier 100 operating principles, for purposes of simplicity, will now be described with reference only to resistor $R_{RM1}$, although the same principles apply to each MR head. A read signal generated via $R_{RM1}$, for example, is first amplified by a wide bandwidth cascade amplifier comprising transistors Q12 and Q10 and a load resistor $R_L$ depicted in stage 1. The amplified read signal thus appears across load resistor $R_L$. The amplified read signal across load resistor $R_L$ is applied to the input of an emitter follower amplifier comprising bipolar transistor Q16, also shown in stage 1. Following amplification of the read signal via emitter follower transistor Q16, the amplified read signal is then passed to a differential amplifier comprising bipolar transistors Q21, Q22, Q23 and Q24 illustrated in stage 2. Although further amplification and signal processing takes place in stage 3 of the MR head preamplifier 100 illustrated in FIG. 3B, this amplification and signal processing is not relevant to the present invention and so will not be further discussed herein. The MR head preamplifier 100 thus comprises a plurality of variable head resistances $R_{RM1-RMX}$ associated cascade amplifiers, i.e. Q12 and Q110; Q13 and Q111, an emitter follower amplifier, i.e. Q16 and a differential amplifier, i.e. Q21, Q22, Q23, Q24, operationally and structurally similar to the corresponding elements of preamplifier 14 illustrated in FIG. 2 and discussed herein before.

A plurality of interrelated circuit properties, discussed herein above, can adversely affect the bandwidth characteristics of the preamplifier 100. The present inventors have found, for example, that the useable bandwidth for the preamplifier 100 is significantly affected by the dominant pole(s) created as a result of the loading of cascade amplifier bipolar transistors Q12, Q13 and others, as well as emitter follower amplifier transistor Q16, on the load resistor $R_L$. The loading characteristics caused by cascade amplifier bipolar transistors Q12, Q13 and so on as well as emitter follower amplifier transistor Q16 at the load resistor $R_L$ are determined in part by the parasitic capacitances, e.g. collector-base capacitance, emitter-base capacitance, associated with each transistor, as discussed above.

Further, the noise properties associated with the preamplifier 100 are adversely affected by thermal noise contributions from cascade bipolar transistors Q110 and Q111 among others, also discussed above. Undesirable thermal noise is additionally generated by emitter follower amplifier transistor Q16 in stage 1 as well as differential amplifier transistors Q21 and Q22 in stage 2 of the preamplifier 100.

As stated herein before, recent advancements associated with HDD technology have made it desirable if not even necessary to further reduce noise associated with MR read head preamplifiers. Particular noise reductions can be useful in formulating MR read head preamplifiers having very wide useable bandwidths essential for accommodating data processing speeds of more than 300 Mbits/sec.

Figure 4A:
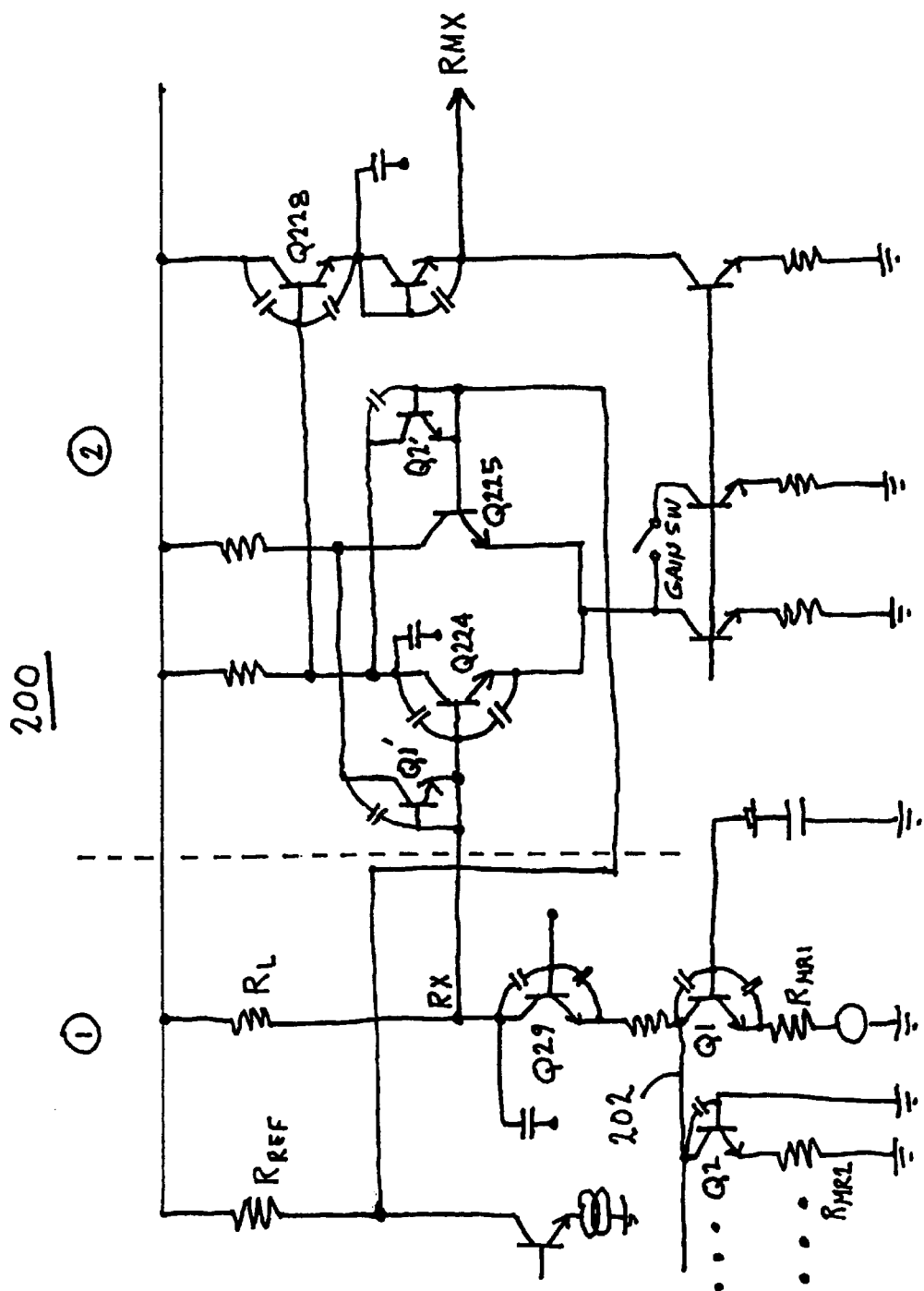
FIGS. 4A and 4B depict a simplified schematic diagram showing a HDD read head preamplifier structure according to a preferred embodiment of the present invention.
Figure 4B:
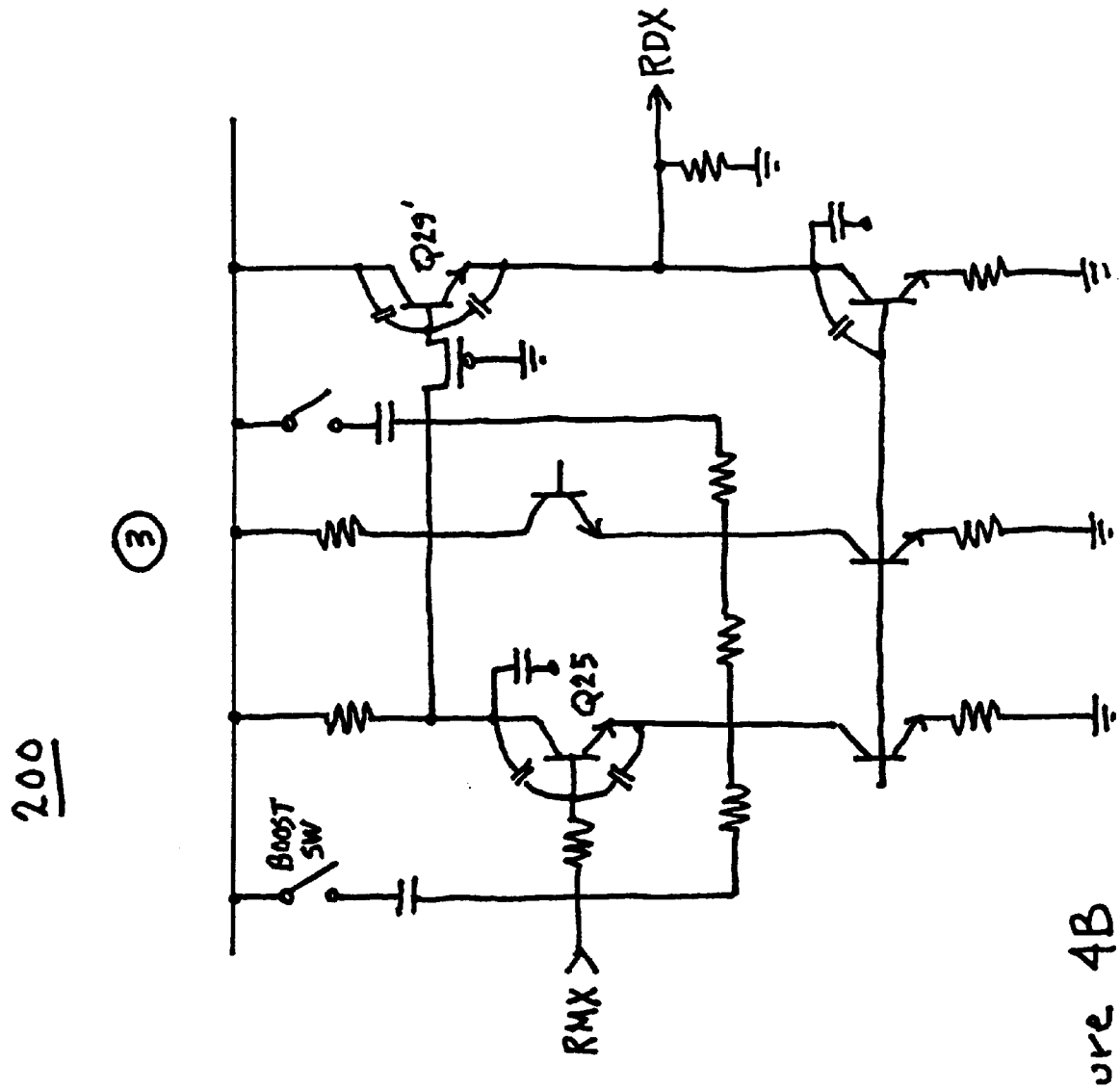

FIGS. 4A and 4B depict a simplified schematic diagram showing three stages of a hard disk drive magneto-resistive read head preamplifier structure 200 according to a preferred embodiment of the present invention. The MR read head preamplifier 200 has less thermal noise and less capacitive loading on the input stage load resistor $R_L$ than that achievable with the familiar preamplifier 100 structure depicted in FIGS. 3A and 3B. The present preamplifier 200 structure allows data to be reliably processed at speeds up to 320 Mbits/sec or even higher.

The present inventors recognized that dominant poles caused by emitter follower amplifier transistor Q16 parasitic capacitance 102 (shown in FIG. 3A) loading at the read preamplifier 100 first stage load resistor $R_L$ are a source of thermal noise that adversely limits the bandwidth capabilities of the read preamplifier 100. Thus, the useable bandwidth of such a preamplifier can be substantially increased if the foregoing dominant poles can be eliminated or substantially increased in frequency. The preamplifier 200 structure illustrated in FIG. 4A can be seen to have each of the read head resistors $R_{RM1}$–$R_{RMX}$ coupled together at a common node 202. The common node 202 is further coupled to the input of a common base amplifier transistor Q29. The foregoing architecture produces a large resultant value of parallel parasitic capacitance associated with the first level input amplifier transistors Q1–QX (where Q29 is the second level amplifier transistor formulated as a common base amplifier). Such an approach appears at first to contradict the necessity to eliminate the above described dominant poles. However, the present inventors also recognized that substituting the common base amplifier configuration of bipolar transistor Q29 for the previous common emitter amplifier configuration of transistor Q16 could in fact remove or substantially reduce the undesirable effects of poles associated with the load resistor $R_L$. The previous structure well known in the art and illustrated in FIG. 3A has a large dominant pole since the load resistor $R_L$ necessarily has a large value. Further, the parallel cascade amplifiers depicted in FIG. 3A present a large parasitic capacitance via direct coupling to the load resistor $R_L$. Thus, the large combination of load resistance $R_L$ and parallel cascade amplifier parasitic capacitance combine to create the foregoing undesirable dominant pole(s). The structure of FIG. 4A however, can be seen to have a large resultant value of parasitic capacitance (parallel parasitic capacitance formed via Q1, Q2, . . . QX)

in combination with a very small impedance when looking into the emitter of the common base amplifier transistor Q29. The foregoing large capacitance/small impedance architecture will therefore generate no undesirable lower frequency poles. This is in direct contrast with known architectures that have a large capacitance/large load resistor structure that results in unwanted and undesirable low frequency poles.

The present inventors also realized that simply eliminating the common emitter amplifier transistor Q16 and using instead a different architecture comprising a common base amplifier transistor Q29, could not alone provide the desired reduction in thermal noise level. This is so because the load resistor $R_L$ is seen to now be coupled directly to one input of differential amplifier transistor pair Q224 and Q225 that again presents a large collector-base parasitic capacitance across load resistor $R_L$. Again, the combination of large parasitic capacitance/large load resistance creates a significant and unwanted pole presenting a source of undesirable thermal noise. The present inventors, however, recognized that the undesirable thermal noise presented by the preamplifier 200 structure of FIG. 4A is significantly different from that generated via the preamplifier 100 structure. They recognized that since the aforesaid thermal noise was now associated with a differential amplifier, they could create a symmetrical cross-coupled transistor (Q1' and Q2') structure to eliminate the unwanted dominant pole(s) created by transistor pair Q224 and Q225. Further, such a structure, using properly matched cross-coupled transistors, Q1', Q2', could effectively eliminate the unwanted low frequency pole(s) over a desired temperature operating range. Such a structure would therefore provide a significant advancement in the present state of read head preamplifier art.

With continued reference to FIG. 4A, transistor Q1' is configured to cancel the collector-base parasitic capacitance effects of differential amplifier transistor Q224. Further, a transistor Q2' is configured to provide symmetry in the differential amplifier and to cancel the collector-base parasitic capacitance effects of differential amplifier transistor Q225. Transistor Q1' is most preferably the same physical size as transistor Q224 and transistor Q2' is most preferably the same physical size as transistor Q225. In this way, the collector-base parasitic capacitance of transistor Q1' will match that of transistor Q224 and the collector-base parasitic capacitance of transistor Q2' will match that of transistor Q225. Proper selection of cross-coupling transistors Q1' and Q2' will ensure that the foregoing matching relationships will be effective over a desired operating range of temperatures.

The cross-coupled transistors Q1' and Q2' function to eliminate or substantially reduce the undesirable effects of parasitic capacitance associated with bipolar transistors Q224 and Q225 via the parasitic capacitance coupled feedback loops created between the collector-base junctions of transistors Q1' and Q2'. The base voltage of bipolar transistor Q224 is seen to be driven upward as the signal voltage at node Rx goes up. As the base voltage of transistor Q224 is driven upward, transistor Q224 turns on, thereby causing the collector voltage of transistor Q224 to go down. As the frequency of the signal at node Rx increases, the collector-base parasitic capacitance of transistor Q224 behave more like a short circuit, also tending to pull down the signal level at node Rx. Thus, the collector base parasitic capacitance of bipolar transistor Q224 reduces the useable bandwidth at higher signal frequencies. As the signal frequency increases for a given signal voltage, however, it can further be seen that the collector-base parasitic capacitance of cross-coupled transistor Q1' will then act as a signal path between the collector of transistor Q225 and the base of transistor Q224. The parasitic collector-base capacitance of transistor Q1' will then counteract the effects caused by the parasitic collector-base capacitance of transistor Q224. This is because the rising collector voltage of transistor Q225 will tend to raise the voltage at node Rx via the signal path through transistor Q1' collector-base parasitic capacitance at higher signal frequencies. In this manner, any preamplifier 200 bandwidth lost via the parasitic collector-base capacitance of transistor Q224 is recovered, along with the reduced thermal distortion discussed herein above. The combined effects of reduced thermal distortion and recovered bandwidth discussed above are substantially increased bandwidth characteristics. Using the foregoing preamplifier 200 at frequencies generally associated with known preamplifier structures, results in substantially reduced signal distortion, i.e., higher signal quality. Further, preamplifier 200 can be used at substantially higher frequencies while providing total thermal distortion equal to or less than that achievable using known preamplifier structures. Known preamplifier structures, for example, generally operate at -1 dB bandwidths up to about 160 MHz. The present preamplifier 200 can operate at bandwidths up to about 320 MHz using the identical -1 dB reference point.

In summary explanation of the above, the present invention effectively eliminates or substantially reduces three sources of thermal noise. The elimination and/or reduction of thermal noise results in a preamplifier structure capable of operation at substantially higher data transmission rates than that achievable with known preamplifier structures. The first mode of thermal noise is through node 202 via the parasitic capacitance associated with each first level input transistor, e.g. Q1, Q2, and so forth. This first mode of thermal noise is eliminated or reduced by coupling each first level input transistor indirectly to the load resistor $R_L$ via a common base amplifier transistor Q29. The second mode of thermal noise is through a parallel load resistor/collector-base parasitic capacitance combination created via a common emitter amplifier transistor Q16 tied to the load resistor $R_L$. This second mode of thermal noise is eliminated by removing the common emitter amplifier transistor Q16 and using instead the foregoing common base amplifier structure. The third mode of thermal noise is through collector-base parasitic capacitance associated with differential amplifier transistors Q224 and Q225. This third mode of thermal noise is eliminated by using cross-coupled transistors Q1' and Q2' to cancel the effects of the collector-base parasitic capacitance of transistors Q224 and Q225 at higher frequencies.

This invention has been described in considerable detail in order to provide those skilled in the equalizer art with the information need to apply the novel principles and to construct and use such specialized components as are required. In view of the foregoing descriptions, it should be apparent that the present invention represents a significant departure from the prior art in construction and operation. However, while particular embodiments of the present invention have been described herein in detail, it is to be understood that various alterations, modifications and substitutions can be made therein without departing in any way from the spirit and scope of the present invention, as defined in the claims which follow.

What is claimed is:

1. A preamplifier for a mass storage device, comprising:
   a shared common base amplifier having an input node configured to receive an input signal from at least one magneto-resistive head and further having an output node configured to pass an output signal in response thereto;

a differential amplifier comprising a first signal output node and a first signal input node, the first signal input node configured to receive the shared common base amplifier output signal, and further comprising a second signal output node and a second signal input node;

a first transistor cross-coupling the first signal input node and the second signal output node; and a second transistor cross-coupling the second signal input node and the first signal output node.

2. The preamplifier according to claim 1 further comprising a plurality of input transistors in electrical communication with a plurality of magneto-resistive heads, the plurality of input transistors sharing a common node configured to transfer the input signal to the shared common base amplifier from the at least one magneto-resistive head.

3. The preamplifier according to claim 2 wherein each input transistor within the plurality of input transistors is configured as a common base amplifier.

4. The preamplifier according to claim 3 further comprising a load resistor connected to the shared common base amplifier output node such that the plurality of input transistors can not function in association with the load resistor to create dominant poles.

5. The preamplifier according to claim 1 wherein the first transistor is configured to prevent input signal degradation caused by a collector-base parasitic capacitance loading associated with the differential amplifier at the first signal input node with increasing input signal frequencies.

6. The preamplifier according to claim 1 wherein the second transistor is configured to provide differential amplifier symmetry such that substantially identical ac signals presented at the differential amplifier first and second signal inputs nodes can be processed to generate substantially identical signals at the differential amplifier first and second signal output nodes respectively.

7. A preamplifier for a mass storage device, comprising:

a common base amplifier transistor having an emitter input node and further having a collector output node;

a differential amplifier comprising a first transistor having a first base input node and a first collector output node, the first base input node connected to the common base amplifier transistor collector output node, and further comprising a second transistor having a second base input node and a second collector output node;

a first coupling transistor having a collector, base and emitter, the first coupling transistor collector connected to the differential amplifier second collector output node, the differential amplifier first base input node connected to the first coupling transistor base and the first coupling transistor emitter; and a second coupling transistor having a collector, base and emitter, the second coupling transistor collector connected to the differential amplifier first collector output node, the differential amplifier second base input node connected to the second coupling transistor base and the second coupling transistor emitter.

8. The preamplifier according to claim 7 further comprising a plurality of input transistors in electrical communication with a plurality of magneto-resistive heads, the plurality of input transistors sharing a common output node in electrical communication with the common base amplifier transistor emitter input node, each input transistor configured to generate output signals responsive to changes in predetermined magneto-resistive head resistance characteristics.

9. The preamplifier according to claim 7 further comprising a load resistor connected to the common base amplifier transistor collector output node.

10. The preamplifier according to claim 7 wherein the first coupling transistor is configured to substantially reduce parasitic capacitance loading associated with the differential amplifier at the first base input node.

11. The preamplifier according to claim 10 wherein the second coupling transistor is configured to stabilize symmetry within the differential amplifier such that parasitic capacitance associated with the first base input node is substantially identical with parasitic capacitance associated with the second base input node over a predetermined range of frequencies and temperatures.

12. A preamplifier for a mass storage device, comprising:

means for generating an ac signal in response to changes in predetermined magneto-resistive head characteristics;

means for amplifying the ac signal and generating an ac output signal therefrom;

means for generating a dc reference signal;

means for determining a difference between the dc reference signal and the ac output signal and generating an ac difference signal therefrom; and means for substantially reducing degradation of the ac difference signal caused by parasitic capacitance associated with the difference determining means.

13. The preamplifier according to claim 12 wherein the means for generating an ac signal comprises a plurality of common base amplifier transistors.

14. The preamplifier according to claim 12 wherein the means for amplifying the ac signal comprises a common base amplifier.

15. The preamplifier according to claim 12 wherein the means for generating a dc reference signal comprises a reference resistor having a value proportional to a predetermined load resistor value such that a desired bias is generated for each magneto-resistive head.

16. The preamplifier according to claim 12 wherein the means for generating a difference comprises a pair of matched transistors, one transistor configured to receive the dc reference signal and the other transistor configured to receive the ac output signal.

17. The preamplifier according to claim 12 wherein the degradation reducing means comprises a pair of cross-coupled transistors configured to substantially cancel collector-base parasitic capacitance associated with the pair of matched transistors.

18. A method of preamplifying a magneto-resistive head signal comprising the steps of:

providing a magneto-resistive head preamplifier having a difference amplifier comprising cross-coupled transistors;

generating a dc reference signal within the preamplifier;

sensing a resistance change in a predetermined magneto-resistive head;

generating an amplified ac signal within the preamplifier in response to the resistance change;

conditioning the amplified ac signal via the cross-coupled transistors; and generating a difference signal from the dc reference signal and the conditioned amplified ac signal.

19. The method according to claim 18 wherein the step of generating an amplified ac signal comprises processing an ac signal by a transistor configured as a common base amplifier.

20. The method according to claim 18 wherein the step of sensing a resistance change comprises biasing a common base transistor to generate an ac output signal proportional to an input signal that changes in response to changes in resistance for a magneto-resistive head in electrical communication with the common base transistor.

* * * * *